United States Patent [19]
Deleonibus

[11] Patent Number: 5,897,939
[45] Date of Patent: Apr. 27, 1999

[54] SUBSTRATE OF THE SILICON ON INSULATOR TYPE FOR THE PRODUCTION OF TRANSISTORS AND PREPARATION PROCESS FOR SUCH A SUBSTRATE

[75] Inventor: Simon Deleonibus, Claix, France

[73] Assignee: Commissariat A l'Energie Atomique, Paris, France

[21] Appl. No.: 08/806,066

[22] Filed: Feb. 25, 1997

[30] Foreign Application Priority Data

Mar. 20, 1996 [FR] France .................................. 96 03448

[51] Int. Cl.⁶ ...................................................... B32B 3/00
[52] U.S. Cl. .......................... 428/195; 428/201; 428/210; 428/446; 428/448; 428/688; 427/376.2; 427/383.5
[58] Field of Search ..................................... 428/195, 201, 428/209, 210, 688, 632, 641, 446, 448; 427/307, 372.2, 376.2, 383.5

[56] References Cited

U.S. PATENT DOCUMENTS

| 4,601,779 | 7/1986 | Abernathey et al. ..................... 156/628 |
| 4,704,302 | 11/1987 | Bruel et al. ............................... 427/38 |
| 4,968,636 | 11/1990 | Sugawara . | |
| 4,997,786 | 3/1991 | Kubota et al. . | |

FOREIGN PATENT DOCUMENTS 0 540 277   5/1993   European Pat. Off. .

OTHER PUBLICATIONS

IBM Technical Disclosure Bulletin, vol. 31, No. 8, Jan. 1, 1989, pp. 114/115 XP000104754 "Self–Aligned Quasi–Semiconductor–on–Insulator Cmos Structure".

IEEE Transactions on Electron Devices, vol. ED–32, No. 2, Feb. 1985, "Analysis of Kink Characteristics in Silicon-on--Insulator MOSFET's Using Two–Carrier Modeling", Koi-chi Kato, et al, pp. 458–462.

Appl. Phys. Lett. 46 (11), Jun. 1, 1985, "Microstructure of Silicon Implanted with high Dose Oxygen Ions", C. Jaus-saud, et al., pp. 1064–1066.

Nuclear Instruments & Methods in Physics Research, Section–B: Beam Interactions with Materials and Atoms, vol. B55, No. 1/04, Apr. 2, 1991, pp. 856–859, XP000230740. Bussmann U et al. "Qxygen Implantation Through Patterned Masks: A Method for Forming Insulated Silicon Device Islands While Maintaining a Planar Wafer Surface".

*Primary Examiner*—Elizabeth Evans
*Attorney, Agent, or Firm*—Pearne, Gordon, McCoy & Granger LLP

[57] ABSTRACT

Process for the preparation of a substrate of the silicon on insulator type for the production of transistors. The process comprises the following stages:

a) shaping the surface of a silicon substrate (10) in order to define a first region (20) and a second region (22) forming a depression with respect to the first region (20), b) formation in the first (20) and second (22) regions of a buried silicon oxide layer (26), which is level with the surface of a transition flank between the regions, c) elimination of the silicon oxide layer (26) level with the flank, d) epitaxying a silicon layer (32) on the first and second regions (20, 22) and on the transition flank, e) levelling the epitaxial layer (32) stopping at the silicon oxide layer (26).

17 Claims, 3 Drawing Sheets

SUBSTRATE OF THE SILICON ON INSULATOR TYPE FOR THE PRODUCTION OF TRANSISTORS AND PREPARATION PROCESS FOR SUCH A SUBSTRATE

DESCRIPTION

1. Technical Field

The present invention relates to a silicon on insulator (SOI) substrate for the production of transistors and to a process for the preparation of such a substrate.

SOI substrates are particularly used in the production of transistors and integrated circuits using such transistors.

The substrates according to the invention can be used for the production of any type of transistor and in particular for field effect transistors of the metal-oxide-semiconductor (MOS), metal-semiconductor (MESFET), junction (JFET) types, as well as for bipolar transistors.

2. Prior Art

The known SOI substrates have a silicon surface layer separated from a solid silicon part by a silicon oxide insulating layer.

The use of SOI substrates makes it possible to significantly reduce the parasitic capacitances of transistors produced in the surface silicon layer. For example, the parasitic capacitance of a source-drain junction of a field effect transistor produced on a SOI substrate can be reduced by a factor of 6 compared with such a transistor produced in a solid silicon substrate.

However, the operation of transistors produced on a SOI substrate and in particular MOSFET's is limited by a characteristic phenomenon of components having an electrically floating substrate and which is known as the kink effect.

This effect is due to the accumulation of electric charges in the floating substrate, i.e. in the thin surface layer. These charges result from parasitic currents produced by an ionization phenomenon as a result of impact at the drain-channel junction of MOSFET's. The accumulated charges create a reverse electric field at the drain-source junction and a "bipolar transistor" formed by the source (emitter), the substrate (base) and the drain (collector) of the field effect transistor can then increase the parasitic currents and give rise to the appearance of the kink effect.

A more detailed analysis of the kink effect is given in document (1), whose reference is indicated at the end of the present description.

The reverse electric field facilitates the passage of a latch-up current. Thus, the kink effect gives rise to stability problems with respect to the characteristics and reliability of transistors produced on a SOI substrate. These problems are particularly linked with the creation of hot electrons and hole currents, which are not collected in a p-type substrate, or hot holes and electron currents in a n-type substrate.

In order to avoid the appearance of the kink effect, there is a deliberate limitation to the supply voltages of transistors produced on a SOI substrate. This measure is prejudicial to the performance characteristics of the transistors and limits the field of application of SOI substrates to devices supplied with a low voltage.

One object of the present invention is to propose a SOI substrate and its production process enabling the production of transistors to take place which are free from the kink effect.

Another object is to propose a substrate compatible with the production of any type of transistor and in particular complimentary metal-oxide-semiconductor transistors (CMOS).

Another object is to propose a simple and effective solution for collecting parasitic currents.

DESCRIPTION OF THE INVENTION

To achieve these objectives, the invention more specifically relates to a process for the preparation of a substrate of the silicon on insulator type for the production of transistors. According to the invention, the process has the following stages:

a) shaping the surface of a silicon substrate in order to define a first region and at least one second region, the second region forming a depression relative to the first region, b) formation in the first and second regions of a silicon oxide layer, the layer being buried in the second region at a depth greater than the thickness of said oxide layer in the first region and substantially level with the surface of at least one transition flank between the first and second regions, c) elimination of the silicon oxide layer level with the transition flank between the first and second regions, d) epitaxying a silicon layer on the first and second regions and on the transition flank between them, e) levelling the epitaxial silicon layer in the first and second regions, stopping at the silicon oxide layer of the first region.

As the silicon oxide is eliminated on the transition flank between the first and second regions and silicon is grown by epitaxy both on said flank and on the second region, this leads to the formation of a connection between the silicon above the buried oxide layer of the second region and the silicon below the oxide layer of the first region.

This connection permits the flow of charges (holes in a p-type substrate and electrons in a n-type substrate) from the epitaxial silicon layer of the second region constituting the active region of the transistors towards the solid part of the substrate, beneath the buried silicon oxide layer.

In the particular case of CMOS (complimentary MOS) type devices, the solid part of the substrate can be defined by doped recesses. For example, for n-channel MOS transistors, the recess is of the p type and conversely for p-channel transistors the recess is of the n type. Contact pieces connected to the recesses can be provided for collecting the parasitic currents.

Typically, the first and second regions can be arranged in such a way that each second region is surrounded and therefore laterally defined by a first region. Thus, the surface silicon layer formed by epitaxy in the second region is electrically insulated by the silicon oxide layer from the first region exposed during stage e) of the process.

According to a particular variant of the process, it is possible, during stage b), to form the silicon oxide layer in such a way that it is buried in the first and second regions at a substantially equal depth.

Moreover, according to an advantageous aspect of the invention, the process can be completed by the following operations:

f) cleaning and oxidizing the surface of the substrate and g) a partial deoxidation of the surface in the second regions.

The oxidation of the surface of the substrate in the first region or regions makes it possible to thicken the surface silicon oxide layer serving as the barrier layer during the levelling of the epitaxial silicon layer. A precise control of the thickness of the lateral contact between the second regions and the substrate is then obtained.

The oxidation, followed by deoxidation of the substrate surface in the second region or regions makes it possible to thin and adjust the thickness of the silicon surface layer. It also permits the formation of a rounded edge between the silicon surface layer of the second region and the silicon oxide surface layer in the first region. Such a rounded edge makes it possible to precisely control the electrical characteristics of the transistors and the quality of the gate oxide of the MOS transistors.

According to another aspect of the invention, it is also possible to implant doping impurities without the silicon oxide layer in the first region and above the silicon oxide layer in the second region, implantation taking place between stages f) and g).

The doping impurities are chosen so as to form doped zones of the same conductivity type as that of the solid part of the substrate.

The doped zones in the first and second regions make it possible to prevent the latch-up phenomenon in the surface silicon layer of the second region, i.e. the region where the transistors are formed. They also improve the electrical contact between said layer and the solid part of the substrate and improve the insulation between the active zones.

According to a particularly advantageous variant of the process according to the invention, the shaping of the substrate surface during stage a) of the process can comprise:
 the formation of a silicon oxide layer on the complete substrate surface,
 the formation of a silicon nitride layer covering the silicon oxide layer in the first region,
 the localized oxidation of the second region in order to form there a thick silicon oxide block,
 the elimination of the silicon nitride layer, the silicon oxide layer and each silicon oxide block.

The elimination of the silicon oxide block or blocks makes it possible to set back the second region or regions with respect to the surface of the first region, in order to form in this way one or more depressions.

According to a variant of the process according to the invention, the buried silicon oxide layer can be formed by an implantation of oxygen ions through the substrate surface and an annealing of the substrate.

Advantageously, it is possible to adjust the dose and energy of the implanted ions in order to form the silicon oxide layer at a given depth in the first and second regions and an implantation angle with respect to the substrate surface is set in order to make the silicon oxide layer substantially level with the transition flank.

According to a particular aspect of the process, a fine or thin silicon oxide layer can be formed by oxidation on the surface of the substrate prior to the implantation of the oxygen ions of the buried oxide layer. The essential function of said fine oxide layer is to "dechannel" the implanted oxygen ions in order to form the buried silicon oxide layer.

The invention also relates to a substrate for the production of transistors. In a first region, the substrate comprises a surface silicon oxide layer covering a solid silicon part and, in at least one second region surrounded by the first region, a surface silicon layer separated from the solid silicon part by a silicon oxide layer. According to the invention, the substrate has at least one contact piece electrically connecting the surface silicon layer of the second region and the solid silicon part of the first region, said contact piece being positioned between the buried silicon oxide layer of the second region and the surface silicon oxide layer of the first region.

Such a substrate is obtained with the process described hereinbefore.

The substrate e.g. has a plurality of second regions surrounded by the first region. The surface silicon layers of the second regions are mutually surface insulated by the silicon oxide layer from the first region.

Transistors and in particular MOS transistors can be formed in the second regions. These transistors are able to withstand high bias voltages with out suffering from the aforementioned kink effect. The carriers of the parasitic currents are not accumulated in the active region, i.e. in the surface silicon layer of the second regions, but are instead directed towards the solid part of the substrate by means of the contact piece or pieces.

Other features and advantages of the invention can be gathered from the following non-limitative, illustrative description with reference to the attached drawings.

DETAILED DESCRIPTION OF EMBODIMENTS OF THE INVENTION

Figure 1:
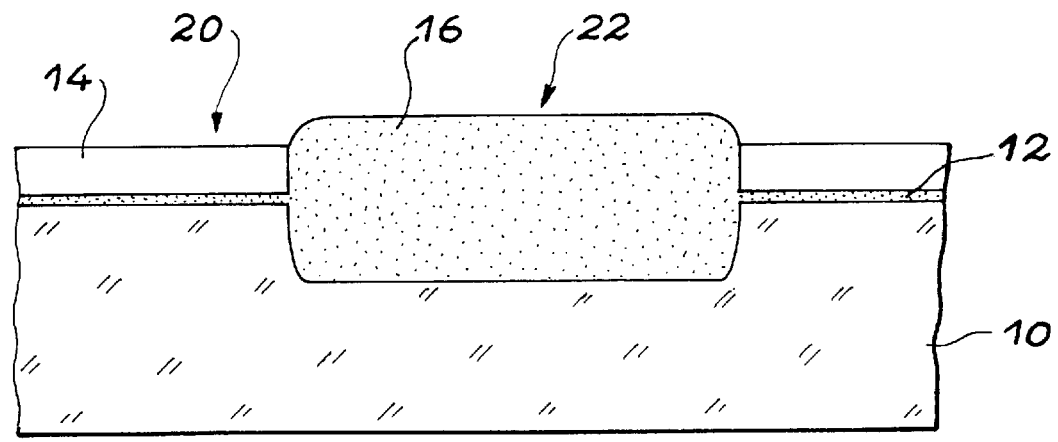
FIGS. 1 and 2 are diagrammatic sections illustrating the shaping stages with respect to the surface of a substrate according to a variant of the process according to the invention.

The following description refers to the preparation of a substrate from a p conductivity silicon wafer or chip 10. However, the stages can be transposed to a wafer of the n type.

A silicon oxide layer 12, called the pedestal layer, is formed by surface oxidation of the silicon wafer 10 and, on said layer 12, is formed a silicon nitride layer 14. The silicon nitride layer 14 is shaped by a masking and etching operation so as to expose the silicon oxide layer 12 in certain regions. A localized oxidation then takes place in said regions in order to form thick silicon oxide blocks 16. This gives the structure shown in FIG. 1.

The substrate parts covered by the silicon nitride layer 14 are designated first region and the parts occupied by the silicon oxide blocks 16, whereof only one is visible in FIG. 1, are designated second regions. The first and second regions are respectively designated 20 and 22.

Several "second regions" 22 can be formed on the substrate and are then surrounded by the first region. However, in the remainder of the text reference will only be made to a single second region, namely that visible in the drawings.

Figure 2:
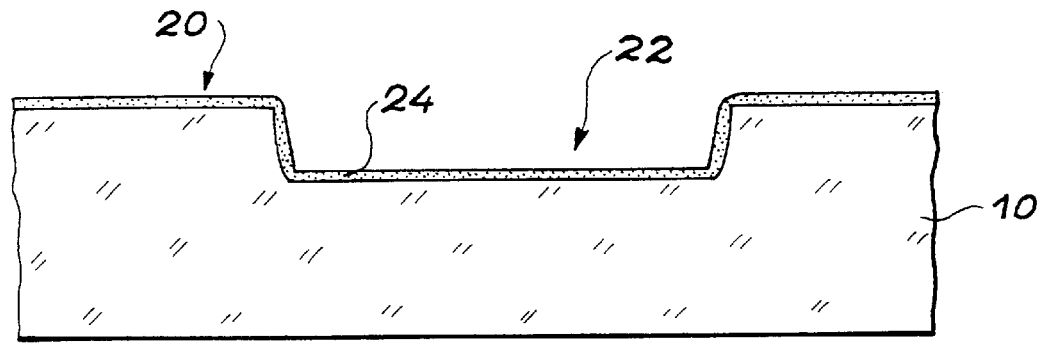

A following stage of the process consists of eliminating the silicon nitride layer 14, the silicon oxide blocks 16 and the pedestal layer 12, with the formation on the complete substrate surface of a thin or fine silicon oxide layer 24, which is formed by oxidation. This gives the structure of FIG. 2. FIG. 2 shows that following this stage the second region 22 forms a depression relative to the surface of the first region.

Figure 3:
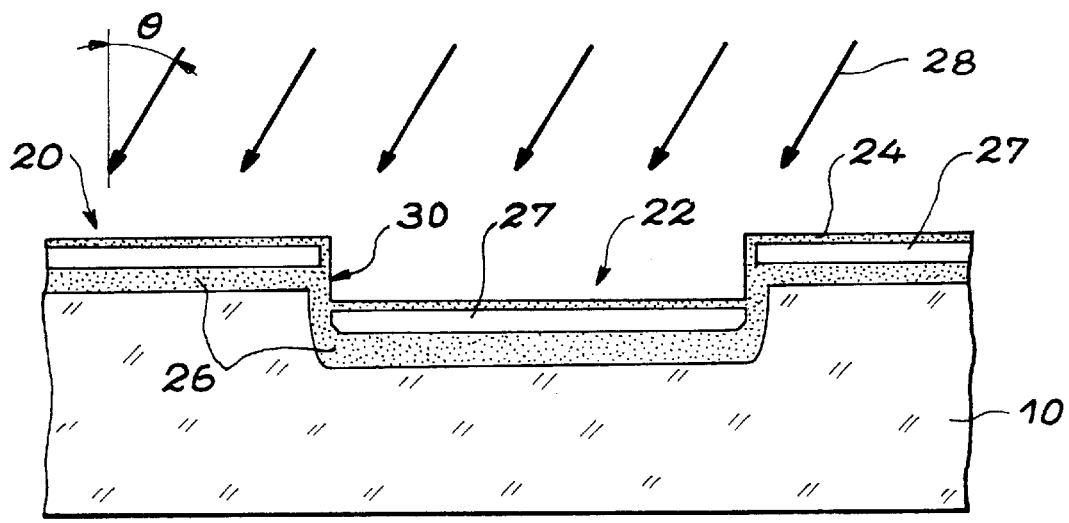
FIG. 3 is a diagrammatic section illustrating the formation of a buried silicon oxide layer in the substrate shown in FIG. 2.

FIG. 3 illustrates the formation of a buried silicon oxide layer 26. In order to form said layer, oxygen ions are implanted in the silicon wafer 10 through its surface. It should be noted in this connection that the silicon oxide layer 24 previously formed on the substrate surface makes it possible to dechannel, i.e. accurately control the projecting beam of implanted oxygen ions so as to obtain implanted zones with homogeneous oxygen concentrations.

After implantation, annealing is carried out in order to obtain and render coherent the layer 26. The layer 26 then defines in the silicon wafer 10 a surface silicon layer 27, which it electrically insulates from a solid silicon part of the wafer.

The energy and dose of the implanted ions are chosen so as to form the layer 26 at a given depth in the first and second regions 20, 22. For example, the layer 26 is buried at a depth between 10 and 200 nm. For producing a buried silicon oxide layer, reference can be made to document (2), whose reference is indicated at the end of the description.

The layer 26 follows the level difference pattern of the substrate surface. Thus, it is buried at an equal depth beneath the substrate surface in the first and second regions.

Arrows 28 in FIG. 3 give an oxygen ion implantation beam orientation. It forms an angle θ with respect to the perpendicular to the substrate plane. Thus, ions are also implanted in the transition flank 30 between the regions 20 and 22, at least on one side of the second region 22. In order to avoid ion deficit by shading of the planes, the wafers are rotated so as to implant the same dose on all the flanks. The ion dose implanted in the transition flank 30 is equal to D.cosθ, in which D is the implantation dose in the first and second regions.

The implantation angle is chosen sufficiently small, i.e. the oxidation profile is made sufficiently steep to ensure that the layer 26 buried in the regions 20, 22 is substantially level with the surface of the transition flank 30. It is considered that the layer 26 is substantially level with the surface, when it is present at the surface or when it is close to the surface, i.e. buried at a very small depth.

In the case where the buried layer 26 is not present at the surface of the flank 30, but at a limited depth beneath the surface, it is also possible to carry out an oxidation in order to thicken the surface oxide layer 24 until the latter reaches the buried layer in the region of the transition flank 30.

A following stage consists of carrying out a partial deoxidation making it possible to completely eliminate the oxide layer 24 at the substrate surface and eliminate the oxide of the layers 24 and 26 on the transition flank 30. The silicon layer and the silicon of the wafer 10 on the flank 30 are consequently exposed.

Figure 4:
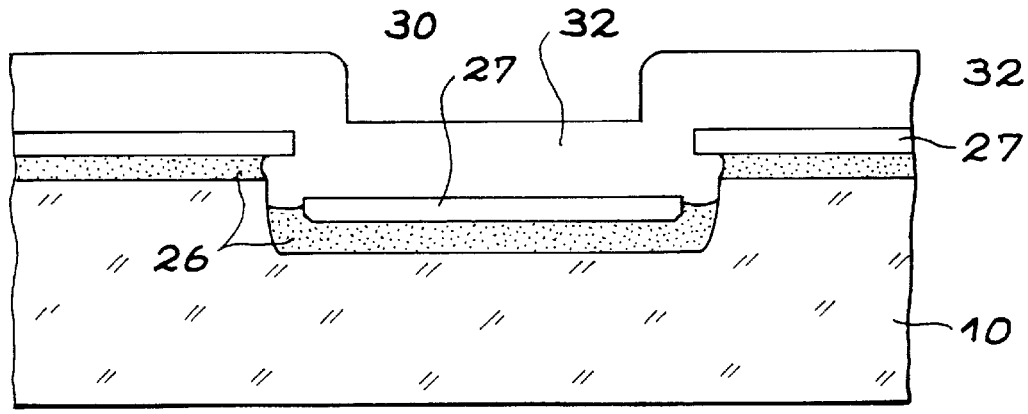
FIGS. 4 to 6 are diagrammatic sections illustrating production and shaping stages for an active zone on the substrate shown in FIG. 3.

The structure shown in FIG. 4 is obtained by forming on the exposed silicon a monocrystalline silicon layer 32. This layer is formed by epitaxy, preferably at a temperature between 850 and 1300° C., e.g. at 1100° C.

The epitaxy is controlled from the surface layer 27 in the first and second regions 20, 22 and from the silicon on the flank 30.

Advantageously, the epitaxying of the monocrystalline layer 32 can be preceded by annealing in order to eliminate any residual contamination and reduce to the minimum the defects in the silicon layer 27.

A following stage consists of smoothing and levelling the silicon layer stopping at the layer 26 of the first region 20.

Figure 5:
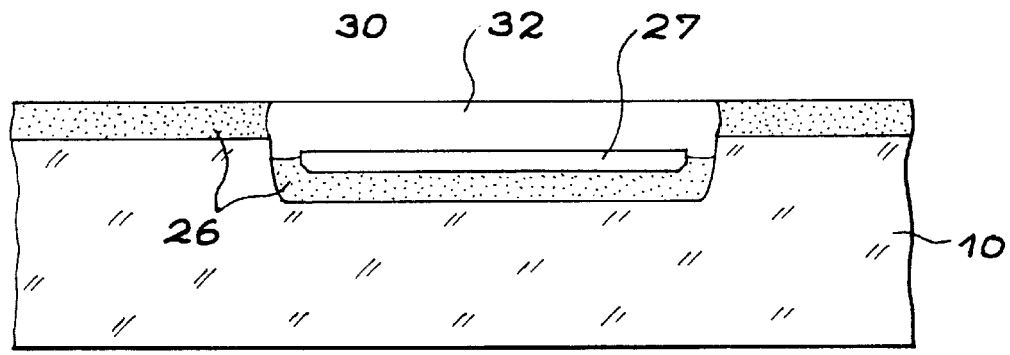

This takes place e.g. by a mechanochemical polishing. The structure shown in FIG. 5 is obtained.

The "buried" layer 26 of the first region 20 is exposed and thereafter appears at the surface of the substrate. In the second region 22, the silicon oxide layer 26 remains covered by the silicon layer 27 and by the monocrystalline silicon layer 32, whose thickness has been reduced during levelling. The substrate surface in the first and second regions is in the same plane following this stage.

Figure 6:
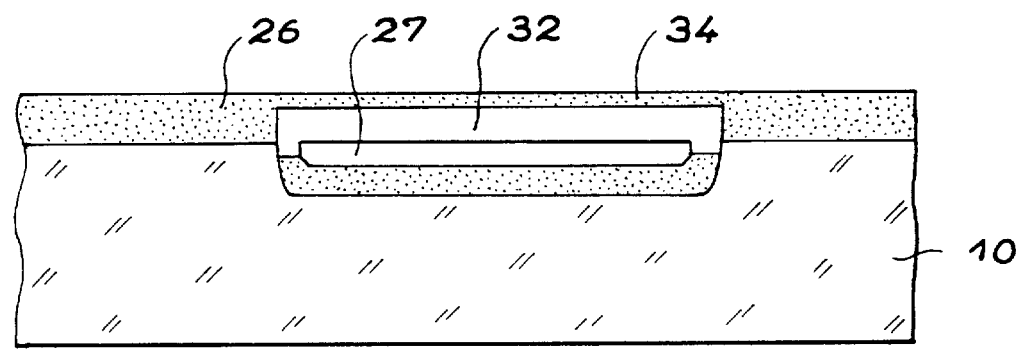

A following stage consists of an oxidation of the substrate surface, as shown in FIG. 6. By forming a new silicon oxide layer 34, this stage makes it possible to thicken the silicon oxide layer 26 in the first region 30 and thin the silicon layer 32 in the second region 22.

An implantation of doping impurities leading to a doping of the same conductivity type as the substrate wafer 10 is carried out through the layer 34. In the present case they are boron impurities, leading to a p type doping.

Figure 7:
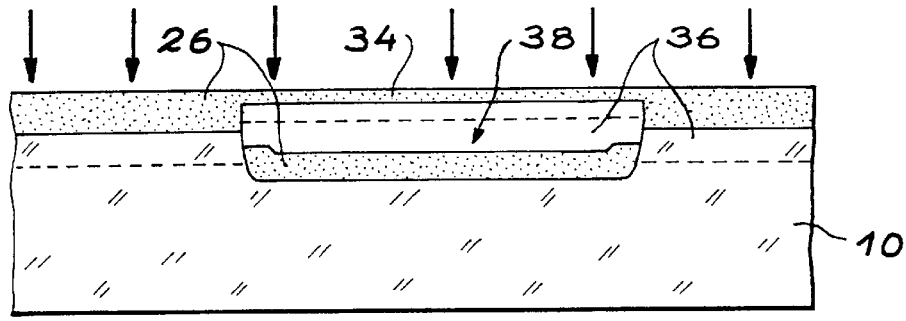
FIG. 7 is a diagrammatic section illustrating a stage of implanting impurities in the substrate of FIG. 6.

Implantation, materialized by the arrows in FIG. 7, makes it possible to form a $p^+$ type doped zone 36 extending beneath the silicon oxide layer 26 in the first region 20 and above the layer 26 in the second region 22. In the second region 22, the doped zone corresponds to the layer 27 and at least part of the layer 32.

The doped zone 36 passing into the region of the transition flank 30 between the regions 20 and 22 makes it possible to improve electrical contacting between the part of the second region above the silicon oxide layer 26 and referred to hereinafter as the "active" region 38 and the solid part of the silicon wafer 10. Zone 36 also has a latch-up-preventing function in the active region 38, where the transistors are subsequently formed.

Figure 8:
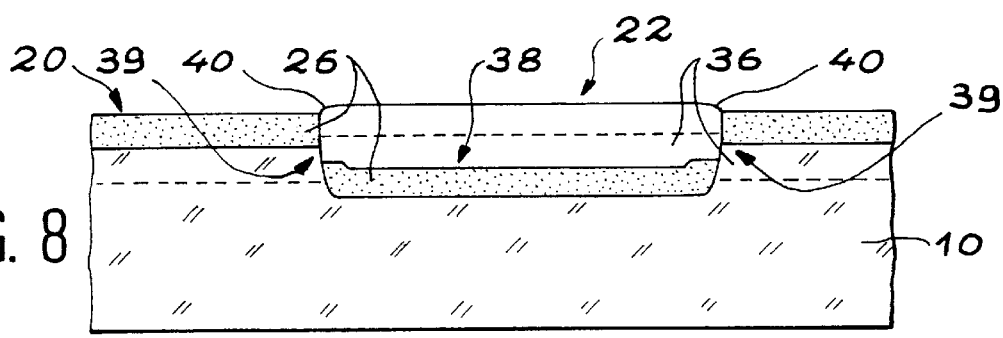
FIG. 8 is a diagrammatic section illustrating a stage of deoxidizing the surface of the substrate of FIG. 7.

Partial deoxidation is followed by boron implantation. It permits the exposure of the active part 38, whose layer 32 has been thinned, whilst preserving an also thinned part of the silicon oxide layer 26 in the first region. This gives the structure shown in FIG. 8.

When the formation of the silicon oxide layer is performed at a relatively high temperature of approximately 1050° C., at the end of deoxidation a rounded edge is obtained between the active part 38 and the silicon oxide layer 26. This rounded edge is given the reference numeral 40.

The substrate finally obtained has a series of recesses with a SOI structure. They are second regions mutually insulated at the surface by the silicon oxide layer of the first region.

One or more contact pieces formed through the flanks of the recesses according to the process described hereinbefore, make it possible to remove the charges (holes) accumulated in the active regions towards the solid part of the substrate and prevent in this way the kink effect. The contact pieces are designated 39 in FIG. 8.

Figure 9:
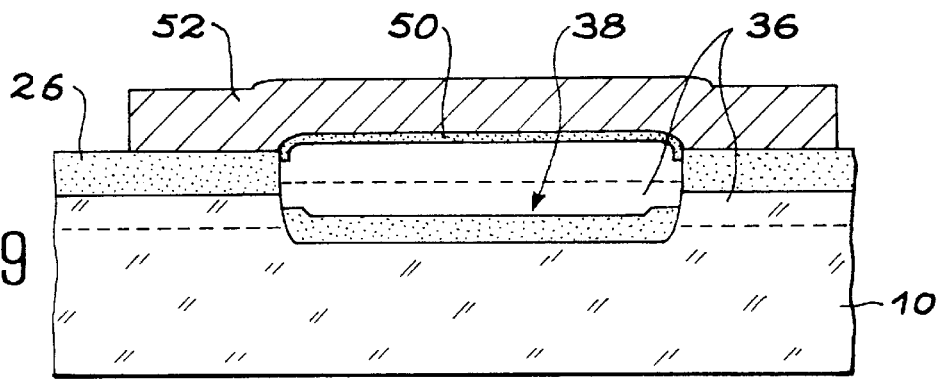
FIGS. 9 and 10 are diagrammatic sections illustrating the production of a field effect transistor in a substrate according to the invention.
Figure 10:
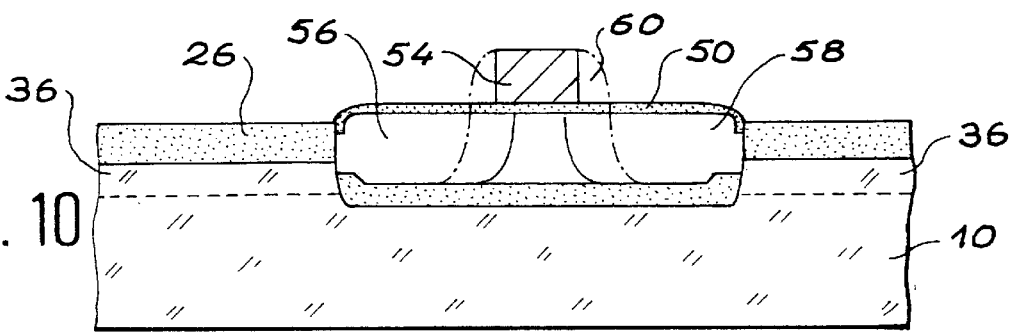

FIGS. 9 and 10 illustrate a use of the substrate prepared in the aforementioned manner in order to produce a field effect transistor. The production stages for the transistor are briefly described below.

FIG. 9 shows the formation, particularly at the surface of the active region, of a gate oxide layer 50 ($SiO_2$) and the deposition of a gate material layer 52, e.g. polycrystalline silicon. The layer 52 is then shaped by the formation of a not shown mask and by selective etching, in order to obtain a gate 54 as shown in FIG. 10.

Source 56 and drain 58 regions are produced in the active region by implantation using the gate 54 as a mask.

The regions 56 and 58 are preferably produced by a double implantation, e.g. with ions leading to a conductivity of the opposite type to that of the solid silicon wafer of the substrate, i.e. opposite to that of the active region.

A first implantation with a low dose is followed by the formation of lateral spacers 60 on the gate 54 and by a second implantation at a higher dose.

In the illustrated case, an implantation of ions leading to a n type conductivity permits the formation of a n channel transistor. The thus produced transistor or circuits do not have a floating potential parasitic base. Thus, they are freed from the kink effect and consequently the transistor is biased with voltages higher than those generally accepted for MOS devices on SOI substrates. This property also leads to the advantage of permitting an increase in the performance characteristics of the thus produced transistors.

CITED DOCUMENTS (1) "Analysis of Kink Characteristics in Silicon-on-Insulator MOSFET's Using Two-carrier Modeling" by KOICHI KATO et al., IEEE Transaction on electron devices, vol. E.D. 32, No. 2, February 1985, pp 458–462

(2) Microstructures of silicon implanted with high dose oxygen ions by C. Jaussaud et al. Appl. Phys. Lett. 46 (11), Jun. 1, 1985, pp 1064–1066.

I claim:

1. Substrate for the production of transistors comprising in a first region (20) a surface silicon oxide layer (26) covering a solid silicon part (10) and, in at least one second region (22) surrounded by the first region (20), a silicon surface layer (27, 32) separated from the solid silicon part by a silicon oxide layer (26), characterized in that the substrate has at least one contact piece (39) electrically connecting the silicon surface layer (27, 32) of the second region (22) and the solid silicon part (10) of the first region (20), the contact piece (39) being located between the buried silicon oxide layer (26) of the second region (22) and the surface silicon oxide layer (26) of the first region.

2. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20),
   b) formation in the first (20) and second regions (22) of a silicon oxide layer (26), the layer being buried in the second region at a depth greater than the thickness of said oxide layer in the first region and substantially level with the surface of at least one transition flank (30) between the first and second regions,
   c) elimination of a portion of the silicon oxide layer (26) at the transition flank (30) between the first and second regions,
   d) epitaxying a silicon layer (32) on the first and second regions (20, 22) and on the transition flank (30) between them,
   e) levelling the epitaxial silicon layer (32) in the first and second regions, stopping at the silicon oxide layer (26) of the first region (20).

3. Process according to claim 2, characterized in that during stage b), formation takes place of a silicon oxide layer (26) in such a way that it is buried in the first and second regions at a substantially equal depth.

4. Process according to claim 2, characterized in that it also involves following stage e):

f) cleaning and oxidizing the substrate surface and
   g) a partial deoxidization of the surface in the second region (22).

5. Process according to claim 4, characterized in that an implantation of doping impurities also takes place beneath the silicon oxide layer (26) in the first region (20) and above the silicon oxide layer (26) in the second region (22), implantation taking place between stages f) and g).

6. Process according to claim 2, characterized in that the substrate surface shaping stage a) comprises:
   the formation of a silicon oxide layer (12) on the complete substrate surface,
   the formation of a silicon nitride layer (14) covering the silicon oxide layer (12) in the first region (20),
   localized oxidation of the second region for the formation of a thick silicon oxide block (16),
   elimination of the silicon nitride layer (14), the silicon oxide layer (12) and the silicon oxide block (16).

7. Process according to claim 2, characterized in that the formation of the buried silicon oxide layer (26) during stage b) comprises an implantation of oxygen ions through the substrate surface and the annealing of the substrate.

8. Process according to claim 7, characterized in that prior to the implantation of the oxygen ions, by oxidation a fine silicon oxide layer (24) is formed at the surface of the substrate, said layer being eliminated during stage c) of the process.

9. Process according to claim 7, characterized in that adjustment takes place to the energy dose of the implanted ions in order to form the silicon oxide layer (26) at a given depth in the first and second regions (20, 22) and adjustment takes place to an implantation angle relative to the substrate surface in order to make the silicon oxide layer substantially level with the transition flank (30).

10. Process according to claim 2, characterized in that the substrate is annealed prior to the epitaxy stage d).

11. Process according to claim 2, characterized in that the epitaxy of stage d) takes place at a temperature between 850 and 1300° C.

12. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20),
   b) formation in the first (20) and second regions (22) of a silicon oxide layer (26), the layer being buried in the second region at a depth greater than the thickness of said oxide layer in the first region and substantially level with the surface of at least one transition flank (30) between the first and second regions,
   c) elimination of a portion of the silicon oxide layer (26) at the transition flank (30) between the first and second regions,
   d) epitaxying a silicon layer (32) on the first and second regions (20, 22) and on the transition flank (30) between them,
   e) levelling the epitaxial silicon layer (32) in the first and second regions, stopping at the silicon oxide layer (26) of the first region (20),
   f) cleaning and oxidizing the substrate surface, and
   g) a partial deoxidization of the surface in the second region (22).

13. Process according to claim 12, characterized in that an implantation of doping impurities also takes place beneath the silicon oxide layer (26) in the first region (20) and above the silicon oxide layer (26) in the second region (22), implantation taking place between stages f) and g).

14. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20), wherein the substrate surface shaping includes the formation of a silicon oxide layer (12) on the complete substrate surface, the formation of a silicon nitride layer (14) covering the silicon oxide layer (12) in the first region (20), localized oxidation of the second region for the formation of a thick silicon oxide block (16), elimination of the silicon nitride layer (14), the silicon oxide layer (12) and the silicon oxide block (16),
   b) formation in the first (20) and second regions (22) of a silicon oxide layer (26), the layer being buried in the second region at a depth greater than the thickness of said oxide layer in the first region and substantially level with the surface of at least one transition flank (30) between the first and second regions,
   c) elimination of a portion of the silicon oxide layer (26) at the transition flank (30) between the first and second regions,
   d) epitaxying a silicon layer (32) on the first and second regions (20, 22) and on the transition flank (30) between them,
   e) levelling the epitaxial silicon layer (32) in the first and second regions, stopping at the silicon oxide layer (26) of the first region (20).

15. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20),
   b) formation of a fine silicon oxide layer (24) by oxidation at the surface of the substrate and formation in the first (20) and second regions (22) of a buried silicon oxide layer (26), the buried layer being buried in the second region at a depth greater than the thickness of said oxide layer in the first region and substantially level with the surface of at least one transition flank (30) between the first and second regions, wherein the formation of the buried silicon oxide layer (26) includes an implantation of oxygen ions through the substrate surface and annealing of the substrate,
   c) elimination of a portion of the silicon oxide layer (26) at the transition flank (30) between the first and second regions and elimination of the fine silicon oxide layer (24),
   d) epitaxying a silicon layer (32) on the first and second regions (20, 22) and on the transition flank (30) between them,
   e) levelling the epitaxial silicon layer (32) in the first and second regions, stopping at the silicon oxide layer (26) of the first region (20).

16. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20),
   b) formation in the first (20) and second regions (22) of a silicon oxide layer (26), the layer being buried in the second region at a depth greater than the thickness of said oxide layer in the first region and substantially level with the surface of at least one transition flank (30) between the first and second regions, wherein the formation of the buried silicon oxide layer (26) includes an implantation of oxygen ions through the substrate surface and annealing of the substrate, an energy dose of the implanted ions is adjusted in order to form the silicon oxide layer (26) at a desired depth in the first and second regions (20, 22), and an implantation angle is adjusted relative to the substrate surface in order to make the silicon oxide layer substantially level with the transition flank (30),
   c) elimination of a portion of the silicon oxide layer (26) at the transition flank (30) between the first and second regions,
   d) epitaxying a silicon layer (32) on the first and second regions (20, 22) and on the transition flank (30) between them,
   e) levelling the epitaxial silicon layer (32) in the first and second regions, stopping at the silicon oxide layer (26) of the first region (20).

17. Process for the preparation of a substrate of the silicon on insulator type for the production of transistors, characterized in that it comprises the following stages:
   a) shaping the surface of a silicon substrate (10) in order to define a first region (20) and at least one second region (22), the second region (22) forming a depression relative to the first region (20),
   b) formation in the first (20) and second regions (22) of a silicon oxide layer (26), the layer being buried in the second region at a depth greater than the thickness of said oxide layer in the first region and substantially level with the surface of at least one transition flank (30) between the first and second regions,
   c) elimination of a portion of the silicon oxide layer (26) at the transition flank (30) between the first and second regions,
   d) epitaxying at a temperature between 850 and 1300° C. a silicon layer (32) on the first and second regions (20, 22) and on the transition flank (30) between them,
   e) levelling the epitaxial silicon layer (32) in the first and second regions, stopping at the silicon oxide layer (26) of the first region (20).

* * * * *